United States Patent
Wang

(10) Patent No.: US 10,551,862 B2
(45) Date of Patent: Feb. 4, 2020

(54) SYSTEM ON CHIP WITH DIFFERENT CURRENT SETTING MODES

(71) Applicant: Nuvoton Technology Corporation, Hsinchu (TW)

(72) Inventor: Cheng-Chih Wang, Hsinchu (TW)

(73) Assignee: Nuvoton Technology Corporation, Hsinchu (TW)

( * ) Notice: Subject to any disclaimer, the term of this patent is extended or adjusted under 35 U.S.C. 154(b) by 0 days.

(21) Appl. No.: 16/145,205

(22) Filed: Sep. 28, 2018

(65) Prior Publication Data

US 2019/0138043 A1    May 9, 2019

(30) Foreign Application Priority Data

Nov. 9, 2017 (TW) ............... 106138735 A

(51) Int. Cl.
  *G05F 3/26* (2006.01)
  *H03K 5/135* (2006.01)
  *H03K 5/00* (2006.01)
  *H03K 19/20* (2006.01)

(52) U.S. Cl.
  CPC .............. *G05F 3/26* (2013.01); *H03K 5/135* (2013.01); *H03K 19/20* (2013.01); *H03K 2005/00078* (2013.01)

(58) Field of Classification Search
  CPC  G05F 3/26; H03K 5/135; H03K 2005/00078; H03K 19/20
  USPC ........................................ 327/261, 269, 284
  See application file for complete search history.

(56) References Cited

U.S. PATENT DOCUMENTS

2011/0004774 A1*  1/2011  Hansquine ............ G06F 1/3203
                                                              713/310

FOREIGN PATENT DOCUMENTS

| CN | 107229303 | 10/2017 |
|---|---|---|
| TW | I493330 | 7/2015 |
| TW | I502302 | 10/2015 |
| TW | 201616796 | 5/2016 |

OTHER PUBLICATIONS

"Office Action of Taiwan Counterpart Application", dated Sep. 25, 2018, p. 1-p. 4.

* cited by examiner

*Primary Examiner* — John W Poos
(74) *Attorney, Agent, or Firm* — JCIPRNET

(57) ABSTRACT

A system on chip (SOC) is provided. The SOC includes a system core logic, a voltage regulator, a clock generator and a system balance circuit. The voltage regulator provides an operating voltage to the system core logic and receives a current setting signal to set the voltage regulator to a low current mode or a high current mode. The clock generator provides a reference clock signal. The system balance circuit receives the reference clock signal to provide the current setting signal to the voltage regulator and provides the system clock signal to the system core logic, wherein the current setting signal is used to set the voltage regulator to the high current mode before the system clock signal is enabled, and set the voltage regulator to the low current mode after the system clock signal is enabled.

9 Claims, 3 Drawing Sheets

SYSTEM ON CHIP WITH DIFFERENT CURRENT SETTING MODES

CROSS-REFERENCE TO RELATED APPLICATION

This application claims the priority benefit of Taiwan application no. 106138735, filed on Nov. 9, 2017. The entirety of the above-mentioned patent application is hereby incorporated by reference herein and made a part of this specification.

BACKGROUND

Technical Field

The disclosure relates to a system on chip and particularly relates to a system on chip with low power consumption.

Description of Related Art

A voltage regulator is usually used to reduce an external input voltage to a lower operating voltage so as to provide the power required for a core logic circuit to operate. In order to cope with dramatic variations in an output load current, a bias current of the voltage regulator is usually designed to be greater than what is required to cope with these dramatic variations. However, when the system enters a low power mode, the output load current drops to several microamperes (μA) or even hundreds of nanoamperes (nA). At this point, the voltage regulator itself has a bias far greater than the output load current and thus is not applicable to a low-power consumption system. Consequently, how to make the voltage regulator meet the requirements of the low-power consumption system and cope with the dramatic variations in the load current has become a focus point in designing the system on chip.

SUMMARY

The disclosure provides a system on chip (SOC) having a voltage regulator that, by a variable bias current of the voltage regulator, is able to meet the requirements of the low-power consumption system and cope with the dramatic variations in the load current.

The SOC of the disclosure includes a system core logic, a voltage regulator, a clock generator, and a system balance circuit. The voltage regulator is coupled to the system core logic, receives a power supply voltage to provide an operating voltage to the system core logic, and receives a current setting signal to set the voltage regulator to a low current mode or a high current mode. The clock generator provides a reference clock signal. The system balance circuit is coupled between the system core logic, the voltage regulator and the clock generator to receive the reference clock signal, provides the current setting signal to the voltage regulator according to the reference clock signal, and provides a system clock signal to the system core logic, wherein the current setting signal is used to set the voltage regulator to the high current mode before the system clock signal is enabled, and set the voltage regulator to the low current mode after the system clock signal is enabled.

Based on the foregoing, in the SOC as recited in the embodiments of the disclosure, before the system clock signal is enabled, the voltage regulator is controlled by the current setting signal to be operated in the high current mode. Consequently, when the system core logic is activated as triggered by the system clock signal, effects of the increased load current on the operating voltage are reduced (i.e., suppressed) to ensure that the system core logic may operate normally.

To make the aforementioned and other features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
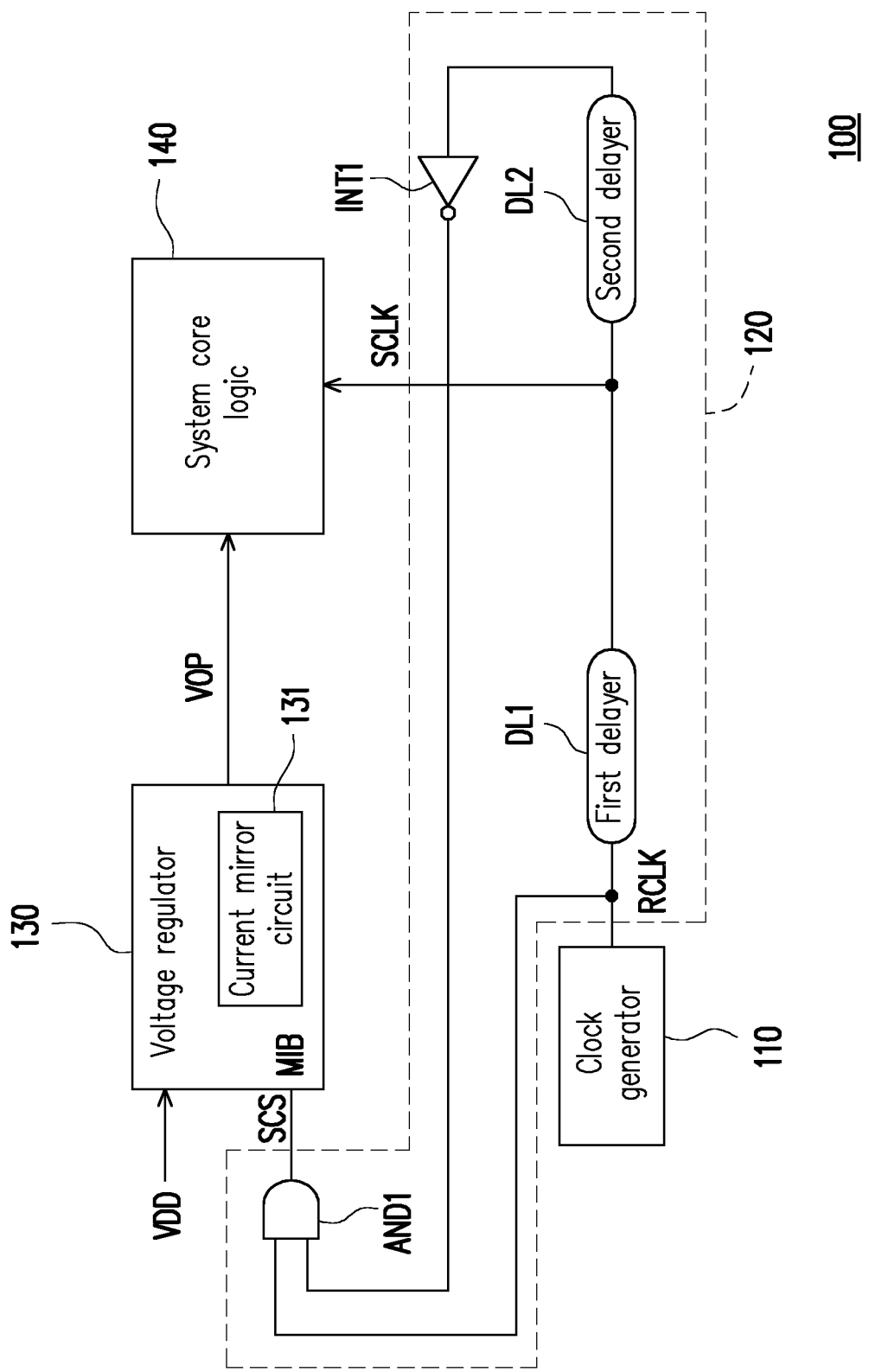
FIG. 1 is a schematic view showing a system of a SOC according to an embodiment of the disclosure.

FIG. 1 is a schematic view showing a system of a SOC according to an embodiment of the disclosure. With reference to FIG. 1, in this embodiment, a SOC 100 includes a clock generator 110, a system balance circuit 120, a voltage regulator 130, and a system core logic 140. The clock generator 110 provides a reference clock signal RCLK, wherein a frequency of the reference clock signal RCLK is lower than 100 kHz. The voltage regulator 130 is coupled to the system core logic 140 and receives a power supply voltage VDD to provide an operating voltage VOP to the system core logic 140. A bias mode terminal MIB of the voltage regulator 130 receives a current setting signal SCS to set the voltage regulator 130 to a low current mode or a high current mode.

The system balance circuit 120 is coupled between the system core logic 140, the voltage regulator 130 and the clock generator 110 to receive the reference clock signal RCLK, provides the current setting signal SCS to the voltage regulator 130 according to the reference clock signal RCLK, and provides a system clock signal SCLK to the system core logic 140 according to the reference clock signal RCLK. The current setting signal SCS is used to set the voltage regulator 130 to the high current mode before the system clock signal SCLK is enabled, and set the voltage regulator 130 to the low current mode after the system clock signal SCLK is enabled.

Based on the foregoing, before the system clock signal SCLK is enabled (i.e., before a rising edge of the system clock signal SCLK), the voltage regulator 130 is controlled by the current setting signal SCS to be operated in the high current mode, that is, a bias current of the voltage regulator 130 is increased. Consequently, when the system core logic 140 is activated as triggered by the system clock signal SCLK, effects of the increased load current on the operating voltage VOP are reduced (i.e., suppressed) to ensure that the system core logic 140 may operate normally.

In this embodiment, the system balance circuit 120 includes a first delayer DL1, a second delayer DL2, a first inverter INT1, and a first AND gate AND1. The first delayer DL1 has an input terminal that receives the reference clock signal RCLK and has an output terminal that provides the system clock signal SCLK. The second delayer DL2 has an input terminal that is coupled to the output terminal of the first delayer DL1 and has an output terminal. The first inverter INT1 has an input terminal that is coupled to the output terminal of the second delayer DL2 and has an output terminal. The first AND gate AND1 has a plurality of input terminals that are coupled to the output terminal of the first inverter INT1 and the clock generator 110 and has an output terminal that provides the current setting signal SCS.

Based on the foregoing, when the reference clock signal RCLK is disabled (such as set to a grounding voltage), the first delayer DL1 and the second delayer DL2 produce a disable output (such as the grounding voltage) one by one according to a time sequence, so that the first inverter INT1 produces an enable output (such as the power supply voltage VDD). At this time, the first AND gate AND1 outputs the current setting signal SCS at a disable level so as to set the voltage regulator 130 to the low current mode.

When the reference clock signal RCLK is enabled (such as set to the power supply voltage VDD), the first AND gate AND1 outputs the current setting signal SCS at an enable level so as to set the voltage regulator 130 to the high current mode. At this time, the first delayer DL1 and the second delayer DL2 still produce the disable outputs.

Then, when the first delayer DL1 outputs the system clock signal SCLK at an enable level, the system core logic 140 is activated as triggered by the system clock signal SCLK. Then, when the second delayer DL2 produces an enable output, the first inverter INT1 produces a disable output, so that the first AND gate AND1 outputs the current setting signal SCS at a disable level. In accordance with the level variations of the current setting signal SCS, the voltage regulator 130 enters the high current mode before the system clock signal SCLK is enabled and switches to the low current mode after the system clock signal SCLK is enabled, thereby providing different bias currents in response to variations in the load current of the system core logic 140.

In this embodiment, the system balance circuit 120 is composed of digital components (such as delayers, AND gates and so on). Moreover, a delay time of the first delayer DL1 is more than or equal to the time needed for the voltage regulator 130 to switch from the low current mode to the high current mode, and the sum of the delay time of the first delayer DL1 and a delay time of the second delayer DL2 is less than or equal to half of an enable period of the system clock signal SCLK.

Besides, since a frequency of the system clock signal SCLK is the same as the frequency of the reference clock signal RCLK, the frequency of the system clock signal SCLK is likewise lower than 100 kHz.

In this embodiment, a current mirror circuit 131 may be disposed inside the voltage regulator 130 to provide different mirror multiples in response to the current setting signal SCS, thereby providing different bias voltages. Furthermore, when the current setting signal SCS is enabled, a mirror multiple of the current mirror circuit 131 is set to a maximum value so that the voltage regulator 130 is operated in the high current mode; when the current setting signal SCS is disabled, the mirror multiple of the current mirror circuit 131 is set to a minimum value so that the voltage regulator 130 is operated in the low current mode.

Figure 2:
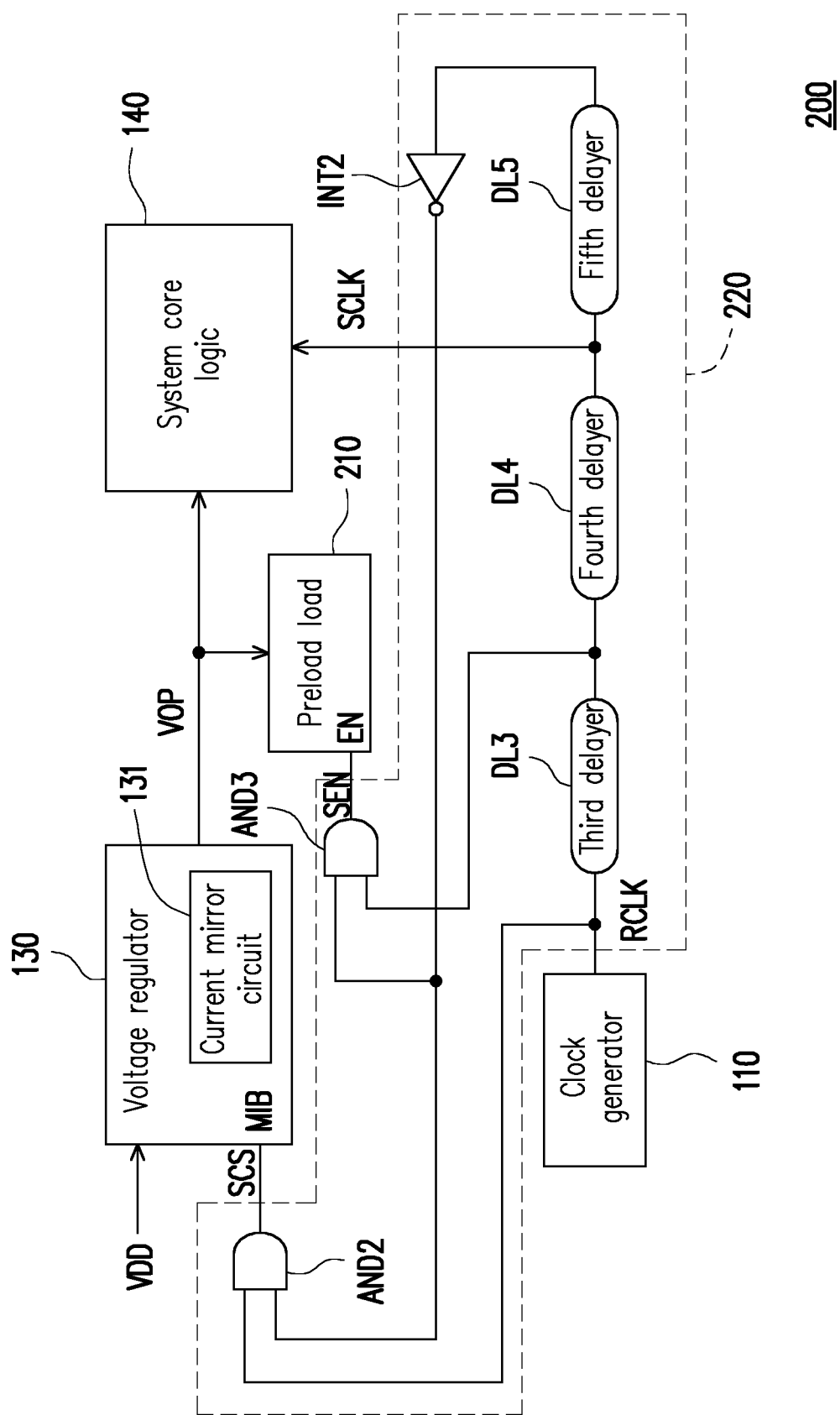
FIG. 2 is a schematic view showing a system of a SOC according to another embodiment of the disclosure.

FIG. 2 is a schematic view showing a system of a SOC according to another embodiment of the disclosure. With reference to FIGS. 1 and 2, in this embodiment, differences between the SOC 200 and the SOC 100 lie in a preload load 210 and a system balance circuit 220, wherein similar or identical components are assigned with similar or identical reference numerals. Here, the SOC 200 further includes the preload load 210 that has an enable terminal EN to receive an enable signal SEN so as to be activated or turned off corresponding to the enable signal SEN. The enable signal SEN is used to activate the preload load 210 before a system clock signal SCLK is enabled and after a voltage regulator 130 is set to a high current mode. The enable signal SEN is also used to turn off the preload load 210 after the system clock signal SCLK is enabled.

In this embodiment, the system balance circuit 220 includes a third delayer DL3, a fourth delayer DL4, a fifth delayer DL5, a second inverter INT2, a second AND gate AND2, and a third AND gate AND3. The third delayer DL3 has an input terminal that receives a reference clock signal RCLK and has an output terminal. The fourth delayer DL4 has an input terminal that is coupled to the output terminal of the third delayer DL3 and has an output terminal that provides the system clock signal SCLK. The fifth delayer DL5 has an input terminal that is coupled to the output terminal of the fourth delayer DL4 and has an output terminal. The second inverter INT2 has an input terminal that is coupled to the output terminal of the fifth delayer DL5 and has an output terminal. The second AND gate AND2 has a plurality of input terminals that are coupled to the output terminal of the second inverter INT2 and the clock generator 110 and has an output terminal that provides a current setting signal SCS. The third AND gate AND3 has a plurality of input terminals that are coupled to the output terminal of the second inverter INT2 and the output terminal of the third delayer DL3 and has an output terminal that provides the enable signal SEN.

Based on the foregoing, when the reference clock signal RCLK is disabled (such as set to a grounding voltage), the third delayer DL3, the fourth delayer DL4 and the fifth delayer DL5 produce a disable output (such as a grounding voltage) one by one according to a time sequence, so that the second inverter INT2 produces an enable output (such as a power supply voltage VDD). At this time, the second AND gate AND2 outputs the current setting signal SCS at a disable level so as to set the voltage regulator 130 to a low current mode, and the third AND gate AND3 outputs the enable signal SEN at a disable level so as to turn off the preload load 210.

When the reference clock signal RCLK is enabled (such as set to the power supply voltage VDD), the second AND gate AND2 outputs the current setting signal SCS at an enable level so as to set the voltage regulator 130 to the high current mode. At this time, the third delayer DL3, the fourth delayer DL4 and the fifth delayer DL5 still produce the disable outputs.

Then, when the third delayer DL3 produces an enable output, the third AND gate AND3 outputs the enable signal SEN at an enable level so as to activate the preload load 210. Then, when the fourth delayer DL4 outputs the system clock signal SCLK at an enable level, a system core logic 140 is activated as triggered by the system clock signal SCLK. Then, when the fifth delayer DL5 produces an enable output, the second inverter INT2 produces a disable output, so that the second AND gate AND2 outputs the current setting signal SCS at a disable level, and the third AND gate AND3 outputs the enable signal SEN at a disable level. In accordance with the level variations of the current setting signal SCS and the enable signal SEN, before the system clock signal SCLK is enabled, the voltage regulator 130 enters the high current mode and the preload load 210 is activated; after the system clock signal SCLK is enabled, the voltage regulator 130 switches to the low current mode and the preload load 210 is turned off. As a result, different bias currents are provided in response to variations in the load current of the system core logic 140.

In this embodiment, the system balance circuit 220 is composed of digital components (such as delayers, AND gates and so on). Moreover, a delay time of the third delayer DL3 is more than or equal to the time needed for the voltage regulator 130 to switch from the low current mode to the high current mode; a delay time of the fourth delayer DL4 is more than or equal to the time needed for the preload load 210 to be activated; and the sum of the delay time of the third delayer DL3, the delay time of the fourth delayer DL4 and a delay time of the fifth delayer DL5 is less than or equal to half of an enable period of the system clock signal SCLK.

Figure 3:
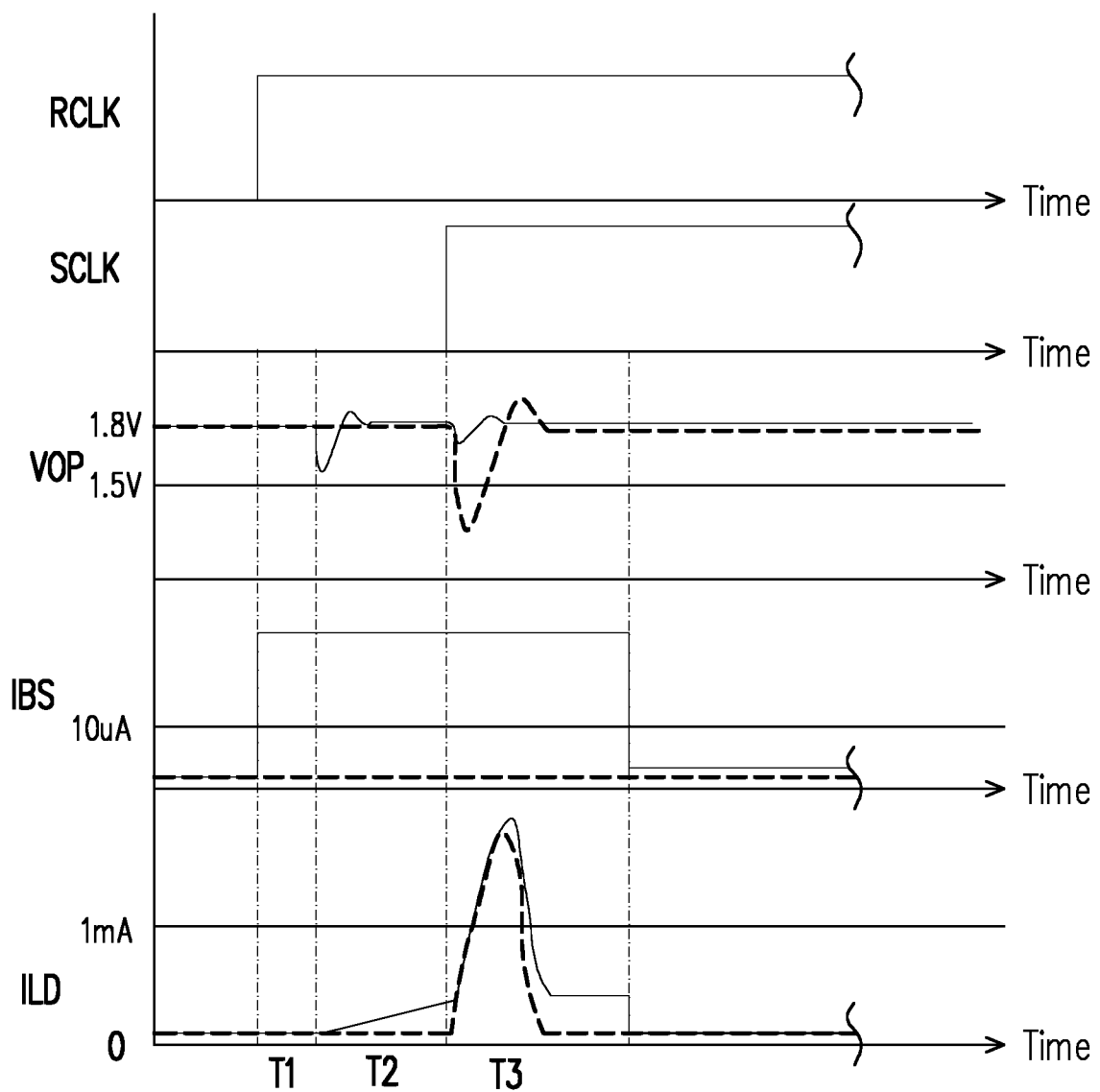
FIG. 3 is a schematic view showing waveforms of a SOC according to another embodiment of the disclosure.

FIG. 3 is a schematic view showing waveforms of a SOC according to another embodiment of the disclosure. With reference to FIGS. 2 and 3, in this embodiment, by controlling a time sequence of a system clock signal SCLK, a voltage regulator 130 generates an adaptive bias current, a preload load 210 is activated or turned off adaptively, and a system balance circuit 220 provides the adaptive system clock signal SCLK, thereby fulfilling the requirements of a low-power consumption system with low operating frequency and reducing the circuit costs and design complexity.

As shown in FIG. 2, the operation method of the circuit is as follows: before the system clock signal SCLK is sent to a system core logic 140, a bias current of the voltage regulator 130 is switched to a larger current. A preload load 210 is then turned on so that an output stage transistor (not shown) of the voltage regulator 130 is switched to a half-on, half-off state. Finally, the system clock signal SCLK is sent to the system core logic 140. After the operation of the system core logic 140 is completed, the bias current of the voltage regulator 130 is switched to a smaller current and the preload load 210 is simultaneously turned off, thereby fulfilling the requirement that a SOC 200 is operated safely and stably using a low-frequency clock with extremely low power consumption.

As shown in FIG. 3, the solid line represents a voltage-current waveform of the SOC 200 as recited in the embodiments of the disclosure, and the dotted line represents a voltage-current waveform in cases where the SOC 200 is not used. Here, an operating voltage VOP is, for example, 1.8 volts (V), a bias current IBS is, for example, measured in the unit of microampere (μA), and a load current ILD is, for example, measured in the unit of milliampere (mA).

Judging from the waveform as illustrated by the solid line, before the system clock signal SCLK is sent to the system core logic 140, the bias current of the voltage regulator 130 has already been increased so as to increase a response speed (as shown by the period T1). In addition, a preload load current mechanism is activated (as shown by the period T2). Consequently, when the system clock signal SCLK is sent to the system core logic 140 (as shown by the period T3), the voltage regulator 130 may quickly respond to dramatic variations of the load current ILD. And after the load current ILD returns to the low current state, the bias current IBS of the voltage regulator 130 is reduced to the original low current state and the preload load 210 is turned off, thereby reducing the overall power consumption of the SOC 200. In contrast, judging from the waveform as illustrated by the dotted line, in face of dramatic variations of the load current ILD, the insufficient response speed of the voltage regulator 130 may cause a huge voltage drop in the operating voltage VOP. As a result, an abnormal state may occur in the system core logic 140 such that the system core logic 140 is not able to function normally.

In summary, in the SOC as recited in the embodiments of the disclosure, before the system clock signal is enabled, the voltage regulator is controlled by the current setting signal to be operated in the high current mode. Consequently, when the system core logic is activated as triggered by the system clock signal, effects of the increased load current on the operating voltage are reduced (i.e., suppressed) to ensure that the system core logic may operate normally. In addition, the preload load is activated before the system clock signal is enabled, which further suppresses the effects of the load current on the operating voltage.

Although the embodiments are already disclosed as above, these embodiments should not be construed as limitations on the scope of the disclosure. It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A system on chip, comprising:
    a system core logic;
    a voltage regulator coupled to the system core logic, receiving a power supply voltage to provide an operating voltage to the system core logic, and receiving a current setting signal to set the voltage regulator to a low current mode or a high current mode;
    a clock generator providing a reference clock signal; and
    a system balance circuit coupled between the system core logic, the voltage regulator and the clock generator to receive the reference clock signal, providing the current setting signal to the voltage regulator according to the reference clock signal, and providing a system clock signal to the system core logic,
    wherein the current setting signal is used to set the voltage regulator to the high current mode before the system clock signal is enabled, and set the voltage regulator to the low current mode after the system clock signal is enabled, so that effects of variations in a load current on the operating voltage are suppressed.

2. The system on chip as recited in claim 1, wherein the system balance circuit comprises:
    a first delayer having an input terminal that receives the reference clock signal and having an output terminal that provides the system clock signal;
    a second delayer having an input terminal that is coupled to the output terminal of the first delayer and having an output terminal;
    a first inverter having an input terminal that is coupled to the output terminal of the second delayer and having an output terminal; and
    a first AND gate having a plurality of input terminals that are coupled to the output terminal of the first inverter and the clock generator and having an output terminal that provides the current setting signal.

3. The system on chip as recited in claim 2, wherein a sum of a delay time of the first delayer and a delay time of the second delayer is less than or equal to half of an enable period of the system clock signal.

4. The system on chip as recited in claim 1, further comprising a preload load receiving an enable signal so as to be activated or turned off corresponding to the enable signal, wherein the enable signal is used to activate the preload load before the system clock signal is enabled and turn off the preload load after the system clock signal is enabled.

5. The system on chip as recited in claim 4, wherein the system balance circuit comprises:
- a third delayer having an input terminal that receives the reference clock signal and having an output terminal;
- a fourth delayer having an input terminal that is coupled to the output terminal of the third delayer and having an output terminal that provides the system clock signal;
- a fifth delayer having an input terminal that is coupled to the output terminal of the fourth delayer and having an output terminal;
- a second inverter having an input terminal that is coupled to the output terminal of the fifth delayer and having an output terminal;
- a second AND gate having a plurality of input terminals that are coupled to the output terminal of the second inverter and the clock generator and having an output terminal that provides the current setting signal; and
- a third AND gate having a plurality of input terminals that are coupled to the output terminal of the second inverter or coupled to the output terminal of the third delayer and having an output terminal that provides the enable signal.

6. The system on chip as recited in claim 5, wherein a sum of a delay time of the third delayer, a delay time of the fourth delayer and a delay time of the fifth delayer is less than or equal to half of an enable period of the system clock signal.

7. The system on chip as recited in claim 4, wherein the enable signal is used to activate the preload load after the voltage regulator is set to the high current mode.

8. The system on chip as recited in claim 1, wherein the voltage regulator has a current mirror circuit; when the current setting signal is enabled, a mirror multiple of the current mirror circuit is set to a maximum value so that the voltage regulator is in the high current mode; and when the current setting signal is disabled, the mirror multiple of the current mirror circuit is set to a minimum value so that the voltage regulator is in the low current mode.

9. The system on chip as recited in claim 1, wherein a frequency of the system clock signal is lower than 100 kHz.

* * * * *